United States Patent [19]

Garner

[11] Patent Number: 4,801,894

[45] Date of Patent: Jan. 31, 1989

[54] FREQUENCY DETECTOR FOR FREQUENCY LOCKED LOOP

[75] Inventor: Grant K. Garner, Corvallis, Oreg.

[73] Assignee: Hewlett-Packard Company, Palo Alto, Calif.

[21] Appl. No.: 113,036

[22] Filed: Oct. 23, 1987

[51] Int. Cl.⁴ .................... H03L 7/08; H03L 7/18; H03D 13/00
[52] U.S. Cl. .................... 331/1 A; 331/25; 307/528; 328/134
[58] Field of Search ............... 331/1 A, 25; 307/510, 307/525, 526, 527, 528; 328/133, 134, 141

[56] References Cited

U.S. PATENT DOCUMENTS 4,494,021  1/1985  Bell et al. .................... 331/25 X Primary Examiner—Eugene R. Laroche
Assistant Examiner—David Mis
Attorney, Agent, or Firm—Bloor Redding, Jr.

[57] ABSTRACT

A frequency synthesizer circuit employs a frequency detector that receives a reference frequency signal and a variable frequency signal and that generates a difference output signal after detecting a complete cycle of the one of the reference frequency and variable frequency signals that is of the highest frequency, the difference output signal being a function of the difference between the frequency of the reference signal and the frequency of the variable frequency signal.

5 Claims, 2 Drawing Sheets

FREQUENCY DETECTOR FOR FREQUENCY LOCKED LOOP

BACKGROUND AND SUMMARY OF THE INVENTION

This invention relates generally to frequency locked loops of the type employed in frequency synthesis circuitry commonly used in calculators and computers to provide a high frequency CPU clock based on a low frequency clock on a chip. More particularly, the present invention is directed to a frequency detector employed in such a frequency locked loop.

One known type of device employed to detect frequency is actually a phase detector whose output is a periodic function of the phase difference of signals applied at its inputs other than the desired output frequency. This device is prone to locking onto a frequency other than the desired output frequency during startup as the result of wide tolerances in on-chip component values and the fact that this type of detector utilizes only phase information in operation. Another type of prior art device for detecting frequency is a phase and frequency detector that is not periodic in the phase plane so it can only lock onto the desired frequency. However, its gain is very high, which may result in the voltage controlled oscillator following it being driven to a very high frequency immediately after turn on of the circuit. In order to eliminate this problem, the low pass filter employed in the frequency synthesis circuit requires a very long time constant, which is quite difficult to realize using on-chip components.

It is therefore an object of the present invention to provide a frequency detector that reduces the problems inherent in prior art detectors which either lock onto an undesired frequency or have such high gain that they cause a significant frequency overshoot on turn-on. This object is accomplished in accordance with the illustrated preferred embodiment of the invention by reducing the amount of phase information in the detection process and instead focusing on frequency difference information. In addition, a decision as to the frequency relationship between two input signals to the frequency detector is made only after the detection of a complete period of the highest frequency input signal.

DESCRIPTION OF THE PREFERRED EMBODIMENT

Figure 1:
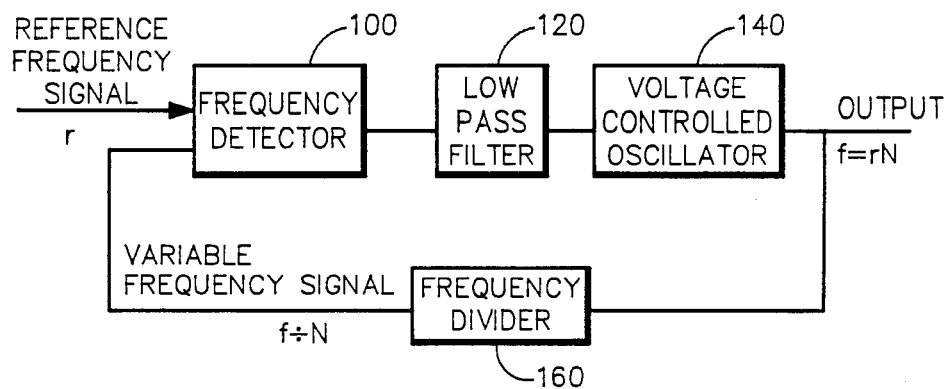
FIG. 1 block diagram of a frequency synthesis loop that includes a frequency detector constructed in accordance with the present invention.
Figure 2:
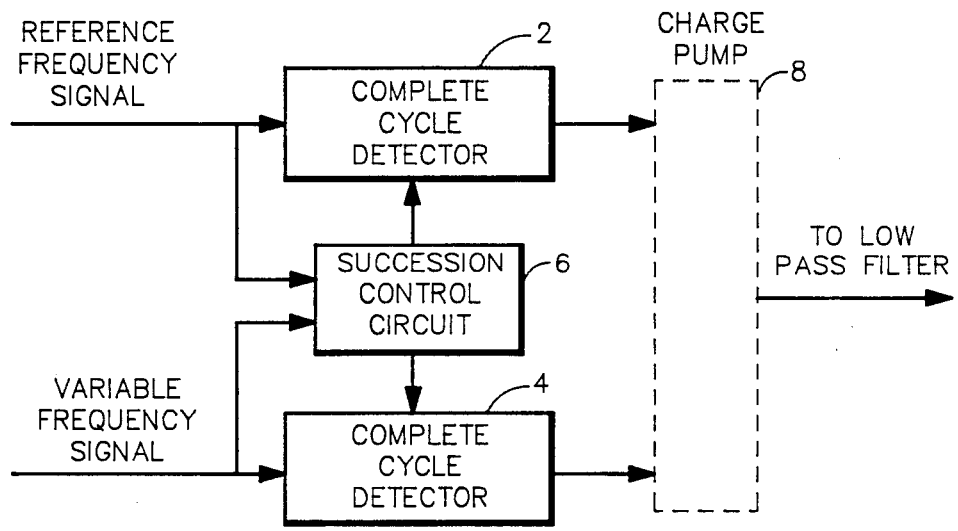
FIG. 2 is a functional block diagram of the frequency detector employed in the circuit of FIG. 1.

Referring now to the block diagram of FIG. 1, there is shown a frequency synthesis loop that comprises a frequency detector 100, a low pass filter 120, a voltage controlled oscillator 140, and a frequency divider 160. FIG. 2 illustrates the blocks that comprise the frequency detector 100 of the frequency synthesis loop of FIG. 1. A first complete cycle detector 2 receives an external reference frequency signal and a second complete cycle detector 4 receives a variable frequency signal from frequency divider 160 of FIG. 1. A succession control circuit 6 receives both the reference frequency and variable frequency signals and provides outputs to the complete cycle detectors 2 and 4. The complete cycle detectors 2 and 4 provide outputs to a conventional charge pump which, in turn, provides an output to low pass filter 120 of FIG. 1.

In operation, complete cycle detector 2 receives the reference frequency signal and, when enabled by succession control circuit 6, generates an output signal that indicates that a specified number of complete cycles of the reference frequency signal have occurred. Complete cycle detector 4 receives the variable frequency signal and, when enabled by succession control circuit 6, generates an output signal that indicates that a specified number of complete cycles of the variable frequency signal have occurred. Succession control circuit 6 receives both the variable and reference frequency signals and generates a signal to enable either complete cycle detector 2 or complete cycle detector 4, depending upon which one of the variable or reference frequency signals began its cycle most recently, as determined by the occurrence of a falling edge of that signal. Conventional charge pump 8 serves to drive low pass filter 120. The outputs of complete cycle detectors 2 and 4 provide an indication of whether the frequency of the variable frequency signal is higher or lower than that of the reference frequency signal. The output is then appropriately changed to raise or lower the frequency of the variable frequency signal.

Figure 3:
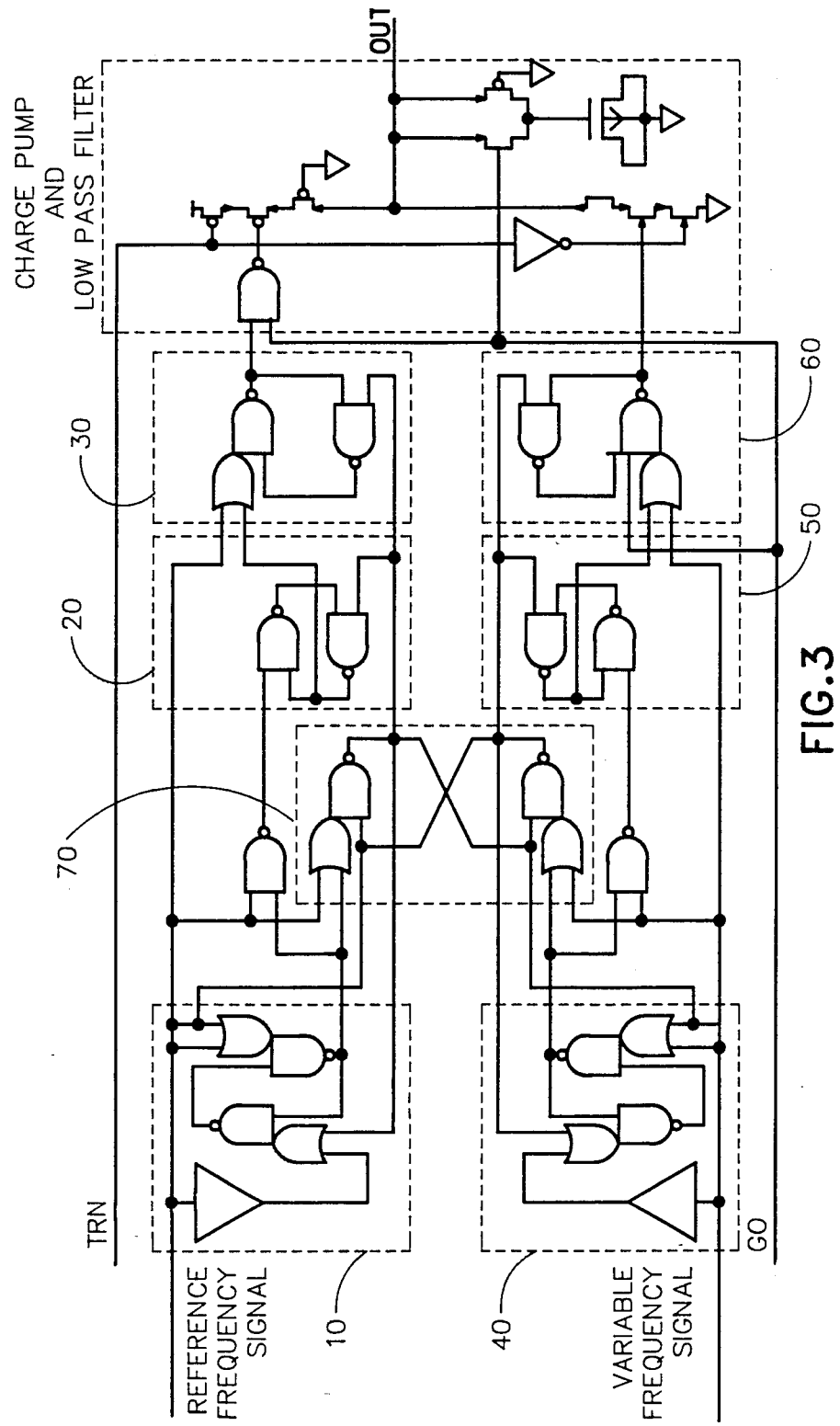
FIG. 3 is a detailed schematic diagram showing a preferred implementation of the frequency detector of FIG. 2.

Referring now to the detailed schematic diagram of FIG. 3, there is shown a circuit comprising conventional logic elements employed to implement complete cycle detector 2, complete cycle detector 4, and succession control circuit 6 of FIG. 2. Complete cycle detector 2 principally comprises flip-flops 10, 20, and 30 interconnected as shown. Flip-flops 10, 20, and 30 comprise conventional set-reset flip-flops that are reset when the enable signal from succession control circuit 6 is not present. Flip-flop 10 starts in the reset state and transitions to the set state on a falling transition of the reference frequency signal. Flip-flop 20 starts in the reset state and transitions to the set state when the reference frequency signal goes high and flip-flop 10 has been set. Flip-flop 30 starts in the reset state and transitions to the set state when the reference frequency signal transitions low for the second time since the complete cycle detector circuit 2 was enabled. Essentially, flip-flop 10 watches for the first falling edge of the reference frequency signal; flip-flop 20 watches for the first rising edge following the first falling edge of the reference frequency signal; and flip-flop 30 watches for the second falling edge of the reference frequency signal. Flip-flops 40, 50, and 60 of FIG. 3 perform precisely the same functions with respect to the variable frequency signal as described above in connection with flip-flops 10, 20, and 30. Flip-flop 70 performs the function of succession control circuit 6 of FIG. 2. In addition to receiving the reference frequency and variable frequency signals, flip-flop 70 receives the outputs of flip-flops 10 and 40 for the purpose of determining which signal cycle began last. This determination is confirmed by the fact that a falling transition is presently being recorded and that no falling transition had been previously recorded for that signal. When flip-flop 30 is set, charge is added to the output, thereby causing the frequency of the variable frequency signal to increase. Similarly, if flip-flop 60 is set, charge is subtracted from the output, thereby causing the frequency of the variable frequency signal to decrease.

I claim:

1. A frequency synthesizer circuit comprising:

frequency detector means for receiving a reference frequency signal and a variable frequency signal and for generating a difference output signal only after detecting a complete cycle of the one of the reference frequency and variable frequency signals that is of the highest frequency, the difference output signal being a function of the difference between the frequency of the reference frequency signal and the frequency of the variable frequency signal;

low pass filter means for receiving the difference output signal and for removing therefrom any signal components above a predetermined cutoff frequency to provide a smoothed control signal;

voltage controlled oscillator means for receiving the smoothed control signal and for producing an output signal whose frequency is a function of the smoothed control signal; and frequency divider means for dividing the frequency of the output signal by an adjustable factor to produce the variable frequency signal that is applied to the frequency detector means.

2. A frequency synthesizer circuit as in claim 1 wherein said frequency detector means comprises:

first complete cycle detector means for receiving the reference frequency signal;

second complete cycle detector means for receiving the variable frequency signal; and succession control circuit means for receiving the reference frequency signal and the variable frequency signal and for selectively enabling the first and second complete cycle detector means as a function of which one of the variable or reference frequency signals began its cycle at the latest point in time;

the first complete cycle detector means being operative, when enabled by the succession control circuit means, for generating an output signal indicating that a specified number of complete cycles of the reference frequency signal have occurred; and the second complete cycle detector means being operative, when enabled by the succession control circuit means, for generating an output signal indicating that a specified number of complete cycles of the variable frequency signal have occurred.

3. A frequency synthesizer circuit as in claim 2 wherein each of said first and second complete cycle detector means comprise a plurality of set-reset flip-flops.

4. A frequency detector comprising:

means for receiving a reference frequency signal and a variable frequency signal and for generating a difference output signal only after detecting a complete cycle of the one of the reference frequency and variable frequency signals that is of the highest frequency, the difference output signal being a function of the difference between the frequency of the reference frequency signal and the frequency of the variable frequency signal.

5. A frequency detector for receiving a reference frequency signal and a variable frequency signal and for generating a difference output signal after detecting a complete cycle of the one of the reference frequency and variable frequency signals that is of the highest frequency, the difference output signal being a function of the difference between the frequency of the reference frequency signal and the frequency of the variable frequency signal, the frequency detector comprising:

first complete cycle detector means for receiving the reference frequency signal;

second complete cycle detector means for receiving the variable frequency signal; and succession control circuit means for receiving the reference frequency signal and the variable frequency signal and for selectively enabling the first and second complete cycle detector means as a function of which one of the variable or reference frequency signals began its cycle at the latest point in time;

the first complete cycle detector means being operative, when enabled by the succession control circuit means, for generating an output signal indicating that a specified number of complete cycles of the reference frequency signal have occurred; and the second complete cycle detector means being operative, when enabled by the succession control circuit means, for generating an output signal indicating that a specified number of complete cycles of the variable frequency signal have occurred.

* * * * *